United States Patent
Ariyama et al.

(10) Patent No.: US 10,908,193 B2
(45) Date of Patent: Feb. 2, 2021

(54) ZERO CROSS DETECTION CIRCUIT AND SENSOR DEVICE

(71) Applicant: ABLIC Inc., Chiba (JP)

(72) Inventors: Minoru Ariyama, Chiba (JP); Tomohiro Oka, Chiba (JP); Yusuke Ezawa, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/390,853

(22) Filed: Apr. 22, 2019

(65) Prior Publication Data

US 2019/0324066 A1 Oct. 24, 2019

(30) Foreign Application Priority Data

Apr. 24, 2018 (JP) .................................. 2018-083377

(51) Int. Cl.
*G01R 19/175* (2006.01)
*G01D 5/14* (2006.01)

(52) U.S. Cl.
CPC ............. *G01R 19/175* (2013.01); *G01D 5/14* (2013.01)

(58) Field of Classification Search
CPC ....... G01D 5/14; G01R 19/175; G01R 31/343
See application file for complete search history.

(56) References Cited

U.S. PATENT DOCUMENTS

| 2012/0249124 | A1 | 10/2012 | Ionescu |
| 2013/0111237 | A1* | 5/2013 | Inukai .................... H02M 7/06 |
| | | | 713/320 |
| 2013/0128623 | A1 | 5/2013 | Hosotani |
| 2014/0145698 | A1 | 5/2014 | Saito et al. |
| 2015/0103567 | A1 | 4/2015 | Wang et al. |
| 2017/0336445 | A1 | 11/2017 | Ariyama |
| 2019/0356307 | A1* | 11/2019 | Wong .................... H05B 45/37 |

FOREIGN PATENT DOCUMENTS

| JP | H07-130082 A | 5/1995 |
| JP | 2017-211365 A | 11/2017 |

OTHER PUBLICATIONS

Extended European Search Report in Europe Application No. 19170856.9, dated Oct. 1, 2019, 12 pages.

* cited by examiner

*Primary Examiner* — Son T Le
*Assistant Examiner* — Adan S Clarke
(74) *Attorney, Agent, or Firm* — Brinks Gilson & Lione

(57) ABSTRACT

A zero cross detection circuit has a first comparator circuit receiving a first input signal and a second input signal and outputting a first comparison result, a second comparator circuit having a hysteresis function, receiving the first input signal and the second input signal, and outputting a second comparison result, a power supply voltage detection circuit outputting a detection signal when a power supply voltage to be supplied becomes equal to or larger than a predetermined voltage, and a logic circuit outputting a zero cross detection signal based on the first comparison result, the second comparison result, and the detection signal.

8 Claims, 12 Drawing Sheets

PRIOR ART

ZERO CROSS DETECTION CIRCUIT AND SENSOR DEVICE

RELATED APPLICATIONS

This application claims priority under 35 U.S.C. § 119 to Japanese Patent Application No. 2018-083377 filed on Apr. 24, 2018, the entire content of which is hereby incorporated by reference.

BACKGROUND OF THE INVENTION

1. Field of the Invention

The present invention relates to a zero cross detection circuit and a sensor device.

2. Description of the Related Art

Heretofore, technical measures for preventing noise of an input signal in the vicinity of zero crossing in a zero cross detection circuit has been studied.

FIG. 12 illustrates a conventional zero cross detection circuit. The conventional zero cross detection circuit has a comparator circuit 90, a comparator circuit 91 having a hysteresis, and a logic circuit 92. The comparator circuit 90 provides a zero cross detection result of an input signal nx1 and an input signal nx2 as a voltage Vout90 to an output terminal out90. The comparator circuit 91 provides a comparison result of the input signal nx1 and the input signal nx2 with a threshold voltage switched depending on a situation as a voltage Vout91 to an output terminal out91.

The logic circuit 92 determines the logic state of an output voltage Vout92 according to the logic states of the zero cross detection result Vout90 supplied from the comparator circuit 90 and the comparison result Vout91 supplied from the comparator circuit 91, and then provides the result to an output terminal out92 as a zero cross detection signal.

In more detail, when the Vout91 is at a high level, the logic circuit 92 causes the transition of the Vout92 to a low level from a high level due to the transition of the Vout90 to a low level from a high level. If the Vout92 is originally at a low level, the Vout92 does not change due to the transition of the Vout90 to a low level from a high level and maintains the low level. The Vout92 does not change due to the transition of the Vout90 to a high level from a low level. On the other hand, when the Vout91 is at a low level, the transition of the Vout92 to a high level from a low level is caused due to the transition of the Vout90 to a high level from a low level. If the Vout92 is originally at a high level, the Vout92 does not change due to the transition of the Vout90 to a high level from low level and maintains the high level. The Vout92 does not change due to the transition of the Vout90 to a high level from a low level.

Since the above-described zero cross detection circuit can eliminate influence of noise of an input signal in the vicinity of zero crossing, the detection of a zero-crossing point can be made with high accuracy. Moreover, since time-independent hysteresis characteristics are imparted, high-speed rotation of a rotor, i.e., high-speed detection, can be achieved (for example, see Japanese Patent Laid-Open No. 2017-211365).

SUMMARY OF THE INVENTION

However, in the conventional zero cross detection circuit consideration was not given to an operation immediately after a power supply voltage is supplied to the circuit, i.e., operation at the start. For example, in the detection of the rotational position of a rotor in a motor with a magnetic sensor, there is a demand for the positional detection immediately after turning on of the power in which the accuracy of the rotational position detection is increased by detecting the position by the application of not a weak magnetic field in the vicinity of zero crossing but a strong magnetic field to ensure the operation at the start of the rotation. The conventional zero cross detection circuit has not responded to such a demand.

Hence, the present invention provides a zero cross detection circuit and a sensor device capable of providing an accurate zero cross detection signal immediately after turning on of the power.

A zero cross detection circuit according to an embodiment of the present invention has a first comparator circuit receiving a first input signal and a second input signal and providing a first comparison result, a second comparator circuit having a hysteresis, receiving the first input signal and the second input signal, and providing a second comparison result, a power supply voltage detection circuit providing a power supply voltage detection signal in response to a power supply voltage becoming equal to or larger than a predetermined voltage, and a logic circuit configured to provide a zero cross detection signal based on the first comparison result, the second comparison result, and the power supply voltage detection signal.

The zero cross detection circuit of the present invention has the power supply voltage detection circuit providing a power supply voltage detection signal to the logic circuit when the power supply voltage becomes equal to or larger than a predetermined voltage, and can thus provide an accurate zero cross detection signal immediately after turning on of the power.

DETAILED DESCRIPTION OF THE PREFERRED EMBODIMENTS

Hereinafter, a zero cross detection circuit and a sensor device of the present invention are described with reference to the accompanying drawings.

First Embodiment

Figure 1:
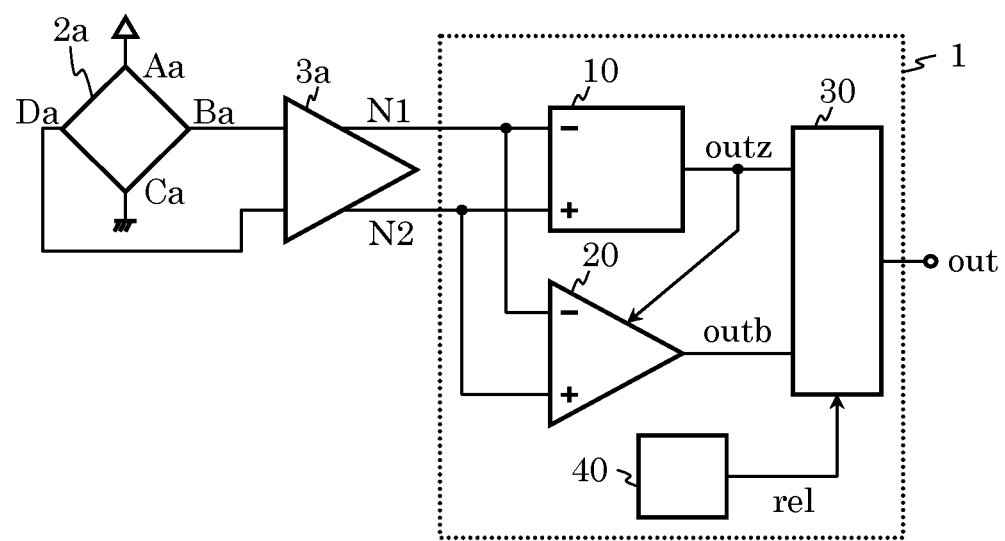
FIG. 1 is a block diagram illustrating a magnetic sensor device having a zero cross detection circuit according to a first embodiment of the present invention.

FIG. 1 is a block diagram illustrating a sensor device having a zero cross detection circuit according to the first embodiment of the present invention. The sensor device according to the first embodiment has a zero cross detection circuit 1, a hall element 2a, and a differential amplifier 3a.

The zero cross detection circuit 1 has a zero-crossing signal generation circuit 10, a comparator circuit 20, a logic circuit 30, and a power supply voltage detection circuit 40. The zero-crossing signal generation circuit 10 includes a comparator circuit as explained later and has an inverted input terminal, a non-inverted input terminal, and an output terminal outz. The comparator circuit 20 has an inverted input terminal, a non-inverted input terminal, a threshold voltage selection terminal, and an output terminal outb. The non-inverted input terminal of the zero-crossing signal generation circuit 10 and the non-inverted input terminal of the comparator circuit 20 are connected in common with a terminal N2. The inverted input terminal of the zero-crossing signal generation circuit 10 and the inverted input terminal of the comparator circuit 20 are connected in common with a terminal N1. The output terminal outz of the zero-crossing signal generation circuit 10 and the output terminal outb of the comparator circuit 20 are connected to the logic circuit 30. The output terminal outz of the zero-crossing signal generation circuit 10 is connected to the threshold voltage selection terminal of the comparator circuit 20. The power supply voltage detection circuit 40 has a power supply terminal (not illustrated) and an output terminal rel. The logic circuit 30 receives signals from the output terminal outz, the output terminal outb, and the output terminal rel as input and provides a logical operation result from the output terminal out as a zero cross detection signal.

The hall element 2a has a terminal Aa, a terminal Ba, a terminal Ca, and a terminal Da. The terminal Aa and the terminal Ca are disposed at opposite positions. The terminal Ba and the terminal Da are disposed at opposite positions. The terminal Aa and terminal Ca are individually connected to interconnecting lines of different potentials. For the sake of explanation, the different potentials are defined as a potential VDD and a potential VSS having a potential lower than that of the potential VDD. The potential of the terminal Aa is defined as VDD and the potential of the terminal Ca is defined as VSS.

The differential amplifier 3a has two input terminals and two output terminals. The terminal Ba and the terminal Da are individually connected to the two input terminals. The two output terminals are individually connected to the terminal N1 and the terminal N2.

In the following description, voltages of the terminal N1, the terminal N2, the output terminal outz, the output terminal outb, the output terminal out, and the output terminal rel are defined as a voltage Vn1, a voltage Vn2, an output voltage Voutz, an output voltage Voutb, an output voltage Vout, and an output voltage Vrel, respectively. A power supply voltage is supplied to the differential amplifier 3a, the zero-crossing signal generation circuit 10, the comparator circuit 20, the logic circuit 30, and the power supply voltage detection circuit 40 from a power supply voltage terminal (not illustrated). For the sake of explanation, suppose that a high potential is defined as VDD and a low potential is defined as VSS among the power supply voltages and that the potential VSS is 0 V (zero bolt), then a power supply voltage Vdd which is a difference between the potential VDD and the potential VSS=0 V is supplied to the circuit.

Signals from the hall element 2a which is a magnetoelectric transducer are supplied to the differential amplifier 3a from the terminal Ba and the terminal Da, the differential amplifier 3a amplifies the signals, and outputs from the differential amplifier 3a are connected to the input terminal N1 and the input terminal N2 of the zero cross detection circuit 1. Herein, voltages of the terminal Ba and the terminal Da are defined as VBa and VDa, respectively, a signal voltage from the hall element 2a is defined as VDa–VBa, and the amplification factor of the differential amplifier 3a is defined as G.

The magnitude and the sign of the signal voltage VDa–VBa from the hall element 2a change according to the Fleming's rule based on the direction of a current flowing through the hall element 2a and the direction of an applied magnetic field. Supposing that the sign of the signal voltage VDa–VBa is positive when a magnetic field is applied in the direction from the front side to the back side of the paper, and that the sign of the signal voltage VDa–VBa is negative when a magnetic field is applied in the direction from the back side to the front side of the paper. When the applied magnetic field is larger, the magnitude of the signal voltage VDa–VBa becomes larger. In an ideal case in which an offset voltage of the hall element 2a is zero, the signal voltage VDa–VBa is zero when the applied magnetic field to the hall element 2a is zero. In the following description the offset voltage of the hall element 2a is supposed to be zero. The signal voltage VDa–VBa from the hall element 2a is amplified by the differential amplifier 3a as shown in the following equation:

$$Vn2-Vn1=G\times(VDa-VBa) \qquad (1).$$

The voltage Vn2–Vn1 takes a positive value, a negative value, or zero according to the applied magnetic field to the hall element 2a. When the applied magnetic field is weak, the absolute Vn2–Vn1 of the voltage Vn2–Vn1 is small. When the applied magnetic field is strong, the value of |Vn2–Vn1| becomes large.

The zero cross detection circuit 1 changes the output voltage Vout according to the voltages Vn2 and Vn1 supplied to the terminal N2 and the terminal N1 to provide as a zero cross detection signal. This operation is described with reference to FIG. 2 and FIGS. 3 to 6.

Figure 2:
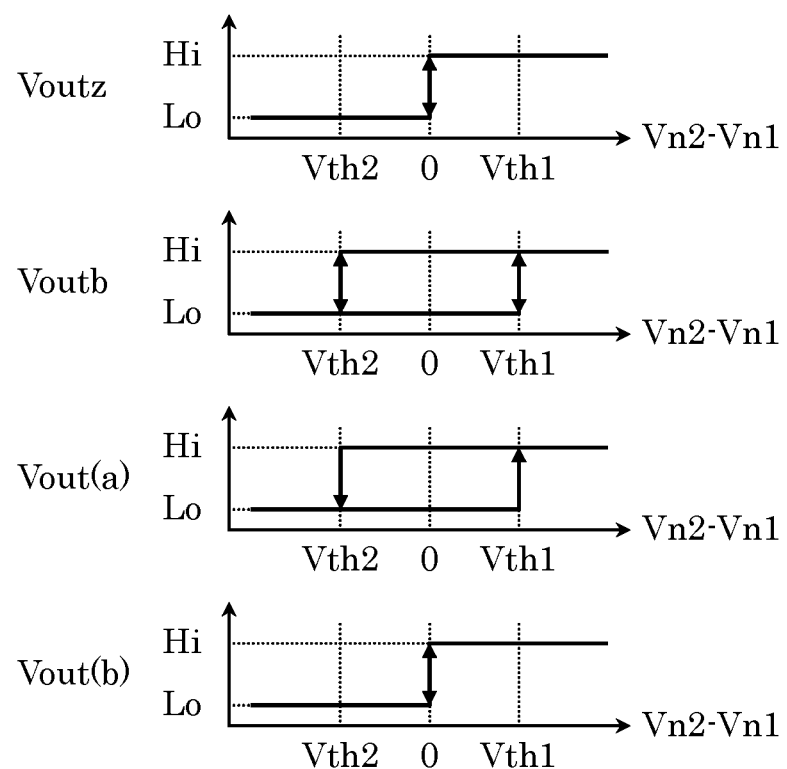
FIG. 2 is a view illustrating an operation of each element of the zero cross detection circuit according to the first embodiment.

First, an operation of the zero-crossing signal generation circuit 10 is described. The zero-crossing signal generation circuit 10 includes more than one comparator circuit which may be collectively referred to as the first comparator circuit in the following description, and provides the first comparison result from the output terminal outz. The operation of the zero-crossing signal generation circuit 10 is to provide a high level from the output terminal outz when a voltage supplied to the non-inverted input terminal is higher than a voltage supplied to an inverted input terminal and, conversely, provide a low level from the output terminal outz when a voltage supplied to the non-inverted input terminal is lower than a voltage supplied to the inverted input terminal. FIG. 2 illustrates details of this operation.

The horizontal axis of FIG. 2 indicates an input voltage difference of the voltage Vn1 and the voltage Vn2 and the vertical axis indicates respective output voltages. The output voltage Voutz provides a high level when the voltage Vn2 is higher than the voltage Vn1, i.e., when Vn2−Vn1>0 holds and, conversely, provides a low level when the voltage Vn2 is lower than the voltage Vn1, i.e., when Vn2−Vn1<0 holds. The zero-crossing signal generation circuit 10 hence provides the output voltage Voutz according to the difference between the supplied voltages Vn2 and Vn1. Herein, the output voltage Voutz is a signal from which noise in the vicinity of the zero crossing, i.e., noise in the vicinity of Vn2−Vn1=0, is removed. An example of the noise removal operation is described later.

Next, an operation of the comparator circuit 20 is described. The comparator circuit 20 provides the second comparison result from the output terminal outb. In the following the comparator circuit 20 may be referred to as the second comparator circuit. The operation of the comparator circuit 20 is to provide a high level from the output terminal outb when a voltage supplied to the non-inverted input terminal is higher than the sum of a voltage supplied to the inverted input terminal and a voltage Vth1 and, conversely, provides a low level from the output terminal outb when a voltage supplied to the non-inverted input terminal is lower than the sum of a voltage supplied to the inverted input terminal and a voltage Vth2. It is determined by the output voltage Voutz which of the voltage Vth1 and the voltage Vth2 is selected. When the output voltage Voutz is at a high level, the voltage Vth1 is selected. When the output voltage Voutz is at a low level, the voltage Vth2 is selected. FIG. 2 illustrates details of this operation. The output voltage Voutb becomes a high level when the voltage Vn2 is higher than the sum of the voltage Vn1 and the voltage Vth1, i.e., when Vn2−Vn1>Vth1 holds and becomes a low level when the voltage Vn2 is lower than the sum of the voltage Vn1 and the voltage Vth2, i.e., when Vn2−Vn1<Vth2 holds. Herein, the voltage Vth1 denotes a threshold voltage which is a positive value and is on the plus side and the voltage Vth2 denotes a threshold voltage which is a negative value and is on the minus side. The output voltage Voutb becomes a high level or a low level according to the selected threshold voltage when the voltage difference Vn2−Vn1 is between the Vth1 and the Vth2, i.e., when Vth2<Vn2−Vn1<Vth1 holds.

Next, an operation of the power supply voltage detection circuit 40 is described. The power supply voltage detection circuit 40 changes the output voltage Vrel according to the power supply voltage to provide a power supply voltage detection signal. The output voltage Vrel which is provided as a power supply voltage detection signal becomes a low level when the power supply voltage is low and becomes a high level when a voltage sufficient for performing a normal circuit operation is supplied.

Next, an operation of the logic circuit 30 is described. The operation of the logic circuit 30 is to determine the logic state of the output voltage Vout according to the logic states of the output voltage Voutz, the output voltage Voutb, and the output voltage Vrel which is a power supply voltage detection signal. Immediately after the transition of the output voltage Vrel to a high level from a low level, the logic circuit 30 provides a voltage Vout determined from the output voltage Voutb of the comparator circuit 20 as a zero cross detection signal. Thereafter, i.e., after providing the voltage Vout determined from the output voltage Voutb of the comparator circuit 20, the operation of the logic circuit 30 is to provide a voltage Vout determined from the output voltage Voutz of the zero-crossing signal generation circuit 10 as a zero cross detection signal. A waveform Vout(a) of FIG. 2 illustrates details of the operation immediately after the transition of the output voltage Vrel to a high level from a low level and a waveform Vout(b) illustrates details of the subsequent operation. Details of this operation are described with reference to FIGS. 3 to 6.

Figure 3:
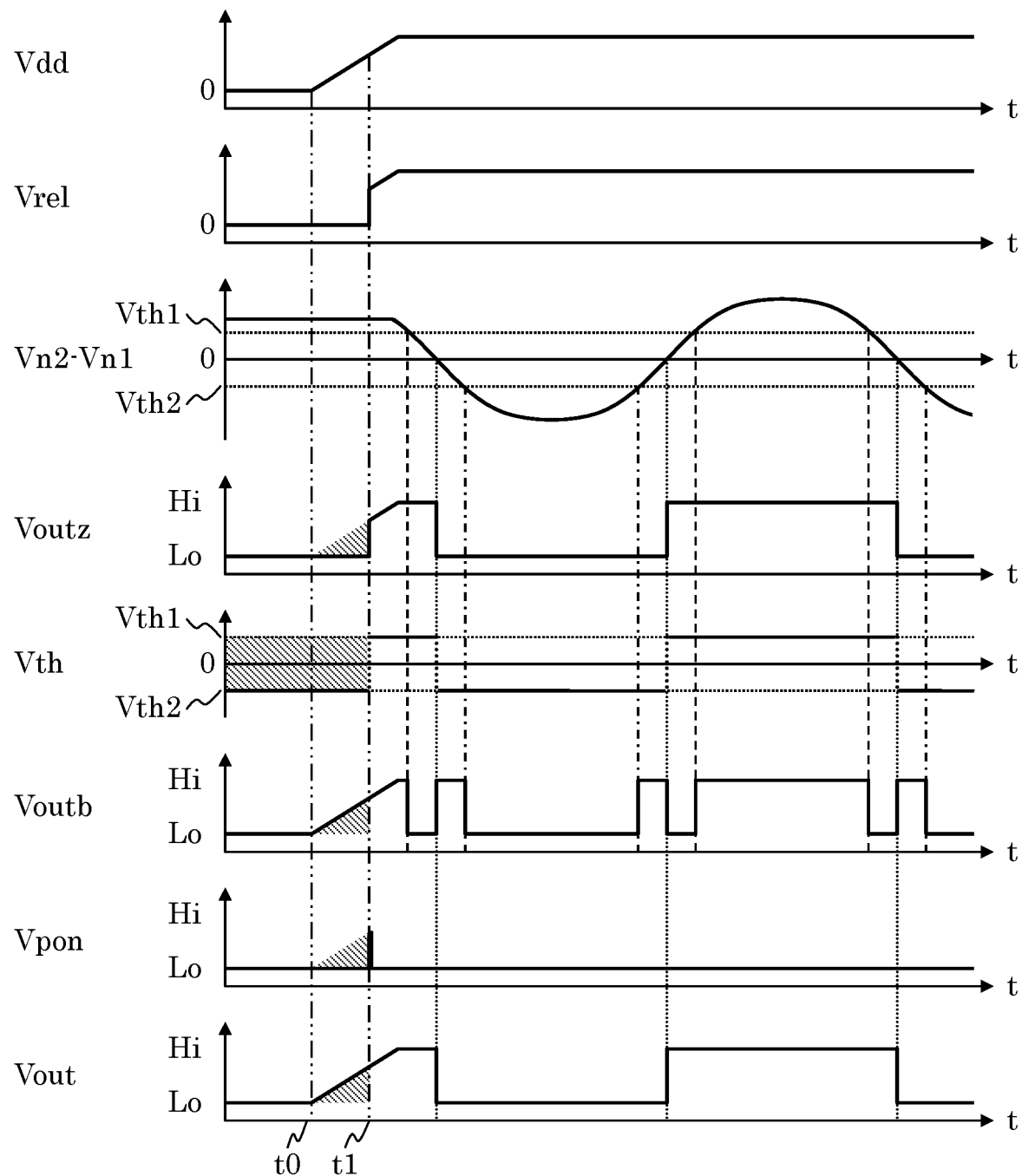
FIG. 3 is a view illustrating an operation of the zero cross detection circuit according to the first embodiment.

FIG. 3 is a view illustrating an operation of the zero cross detection circuit 1 after the power is turned on in the case of a sufficiently strong positive signal, i.e., when Vn2−Vn1>Vth1 holds. Herein, the horizontal axis indicates a passage of time and the vertical axis indicates an input voltage difference or an output voltage. Specifically, in the vertical axis names, Vdd is the power supply voltage, Vth indicates the threshold voltage selected in the comparator circuit 20 by thick line, and Vpon is an internal signal of the logic circuit 30 whose operation is described in detail later.

The power supply voltage Vdd supplied to the circuit starts to rise from 0 V (zero bolt) at time t0 and reaches a voltage sufficient for the circuit to normally operate at time t1. The output voltage Vrel, which is the power supply voltage detection signal, of the power supply voltage detection circuit 40 changes from a low level to a high level at time t1 in response to the fact that the power supply voltage Vdd has reached a voltage sufficient for the normal operation of the circuit.

Before time t1, since the power supply voltage Vdd supplied to the circuit is low, the zero-crossing signal generation circuit 10 and the comparator circuit 20 do not operate normally or accurately and there is a possibility that the output voltages corresponding to the input voltages cannot be obtained regarding the output voltage Voutz which is the first comparison result and the output voltage Voutb which is the second comparison result. Moreover, also regarding Vout which is the zero cross detection signal, there is a possibility that the output voltage corresponding to the input voltages cannot be obtained. The situation is indicated by hatched lines in FIG. 3. In order to determine the operation, then the output voltages Voutz, Voutb, and Vout may be forcibly set to a low level or a high level when the power supply voltage Vdd is low. An operation of forcibly setting the output voltages Voutz and Voutb to a low level or a high level can be achieved by connecting the output voltage Vrel of the power supply voltage detection circuit 40 to the zero-crossing signal generation circuit 10 and the comparator circuit 20, which is not shown in the drawing though. FIG. 3 illustrates a case where the output voltage Voutz is forcibly set to a low level to make the output voltages Voutb and Vout set to a high level when the output voltage Vrel is at a low level.

After time t1, since the power supply voltage Vdd has reached a voltage sufficient for the circuit to normally operate, the zero-crossing signal generation circuit 10 and the comparator circuit 20 can be regarded as operating normally and accurately. Accordingly, the output voltages Voutz and Voutb can also be regarded as output voltages correctly corresponding to the input the voltages Vn2 and Vn1.

Immediately after time t1, since Vn2−Vn1>0 holds, the zero-crossing signal generation circuit 10 provides a high level to the output voltage Voutz. Hence, the voltage Vth1 is selected for the threshold voltage Vth of the comparator circuit 20. Since Vn2−Vn1>Vth1 holds, the comparator circuit 20 provides a high level to the output voltage Voutb. The logic circuit 30 determines that a sufficiently large signal is supplied because the output voltage Voutz and the output voltage Voutb are at high levels and are at the same level, and then the logic circuit 30 provides a voltage determined from the output voltage Voutb of the comparator circuit 20, i.e., a high level, to the output voltage Vout. A voltage Vpon is an internal signal of the logic circuit 30 which becomes a high level before the logic circuit 30 provides the voltage determined from the output voltage Voutb of the comparator circuit 20 and becomes a low level after the logic circuit 30 provides the voltage determined from the output voltage Voutb of the comparator circuit 20, and which is not illustrated in the circuit diagram. As an example of a configuration, the voltage Vpon is set to be a high level when the output voltage Vrel becomes a high level, and the voltage Vpon is reset to be a low level when the output voltages Voutz and Voutb become the same level. The logic circuit 30 provides a voltage determined from the output voltage Voutb to the voltage Vout when the voltage Vpon is at a high level and provides a voltage determined from the output voltage Voutz to the voltage Vout when the voltage Vpon is at a low level. In this case, immediately after time t1, the voltage based on the output voltage Voutb which is the second comparison result is provided to the output voltage Vout which is the zero cross detection signal and the voltage Vpon transitions to a low level from a high level as described above. After this operation, the logic circuit 30 operates to provide a voltage determined from the output voltage Voutz which is the first comparison result of the zero-crossing signal generation circuit 10 to the output voltage Vout as the zero cross detection signal.

Figure 4:
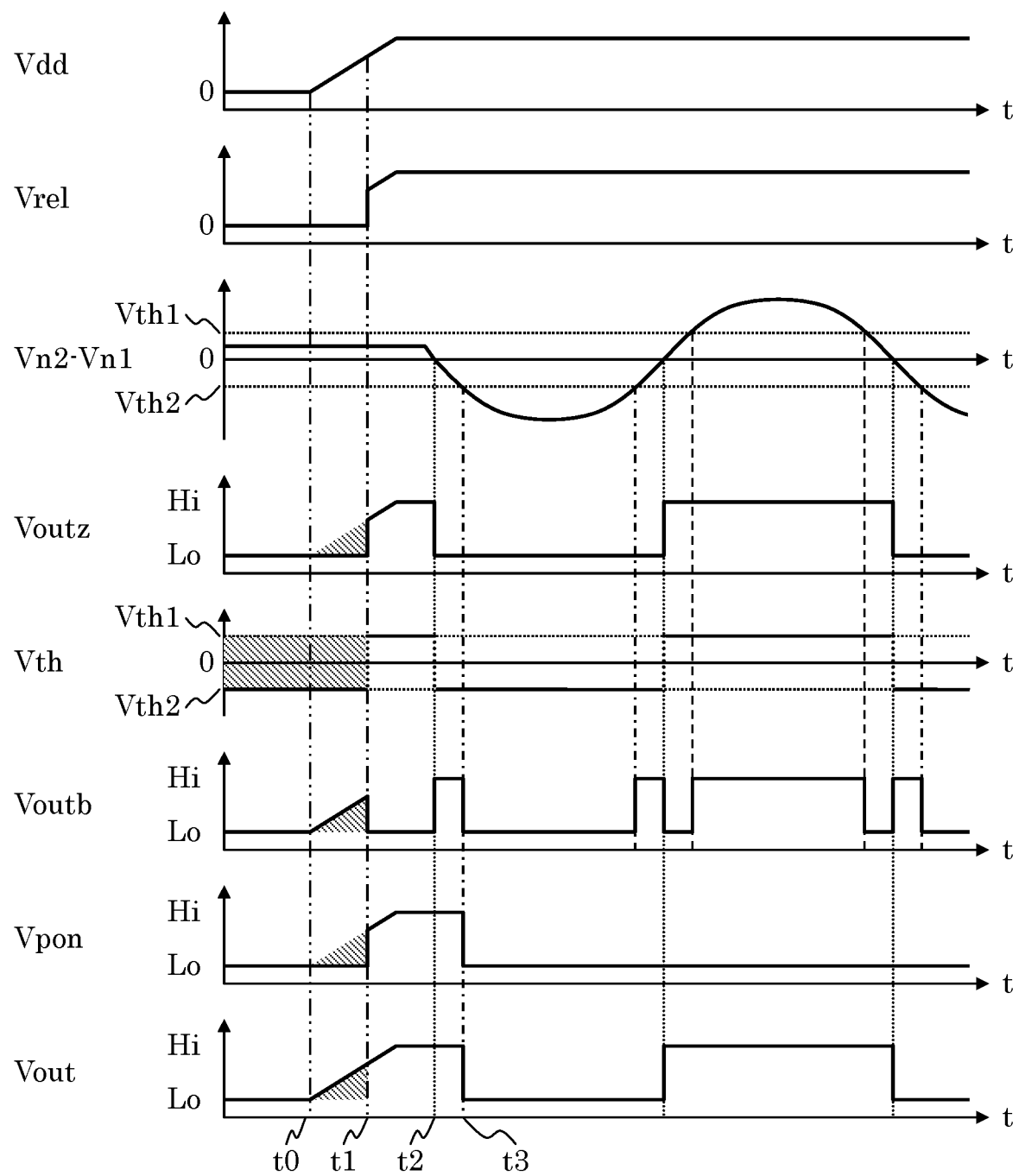
FIG. 4 is a view illustrating an operation of the zero cross detection circuit according to the first embodiment.

FIG. 4 is a figure illustrating an operation of the zero cross detection circuit 1 when power is supplied in the case of a weak positive signal, i.e., when $0<Vn2-Vn1<Vth1$ holds. The waveforms of the power supply voltage Vdd and the output voltage Vrel are the same as those of FIG. 3 and hatched portions are also the same as those of FIG. 3. The waveforms of the Voutz, the Voutb, the Vpon, and the Vout at the time until time t1 are also the same as those of FIG. 3.

Immediately after time t1, since $Vn2-Vn1>0$ holds, the zero-crossing signal generation circuit 10 provides a high level to the output voltage Voutz. Accordingly, the comparator circuit 20 selects the voltage Vth1 for the threshold voltage Vth. Since $Vn2-Vn1<Vth1$ holds, the comparator circuit 20 provides a low level to the output voltage Voutb. The logic circuit 30 determines that a small signal is supplied because the output voltage Voutz is at a high level, the output voltage Voutb is at a low level, and the output voltage Voutz and the output voltage Voutb are at different levels. The logic circuit 30 does not change the output voltage Vout and holds the high level which is the immediate preceding voltage. The high level is held also for the voltage Vpon.

The Vn2–Vn1 starts to change after time t1 and reaches $Vn2-Vn1=0$ at time t2. More specifically, zero crossing occurs. Immediately after time t2, since $Vn2-Vn1<0$ holds, the zero-crossing signal generation circuit 10 provides a low level to the output voltage Voutz. Accordingly, the voltage Vth2 is selected for the threshold voltage Vth of the comparator circuit 20. Since $Vn2-Vn1>Vth2$ holds, the comparator circuit 20 provides a high level to the output voltage Voutb. The logic circuit 30 determines that a small signal is supplied because the output voltage Voutz is at a low level, the output voltage Voutb is at a high level, and the output voltage Voutz and the output voltage Voutb are at different levels. The logic circuit 30 does not change the output voltage Vout and holds the high level which is the immediate preceding voltage. The high level is held also for the voltage Vpon.

Change of the Vn2–Vn1 continues even after time t2 and reaches $Vn2-Vn1=Vth2$ at time t3. Immediately after time t3, $Vn2-Vn1<Vth2$ holds, and then the comparator circuit 20 provides a low level to the output voltage Voutb. The logic circuit 30 determines that a sufficiently large signal is supplied because the output voltage Voutz and the output voltage Voutb are at low levels and are at the same level. The logic circuit 30 provides a voltage determined from the output voltage Voutb of the comparator circuit 20, i.e., a low level, to the output voltage Vout. The voltage Vpon transitions to a low level from a high level. After this operation, the logic circuit 30 operates to provide the voltage determined from the output voltage Voutz of the zero-crossing signal generation circuit 10 to the output voltage Vout.

Figure 5:
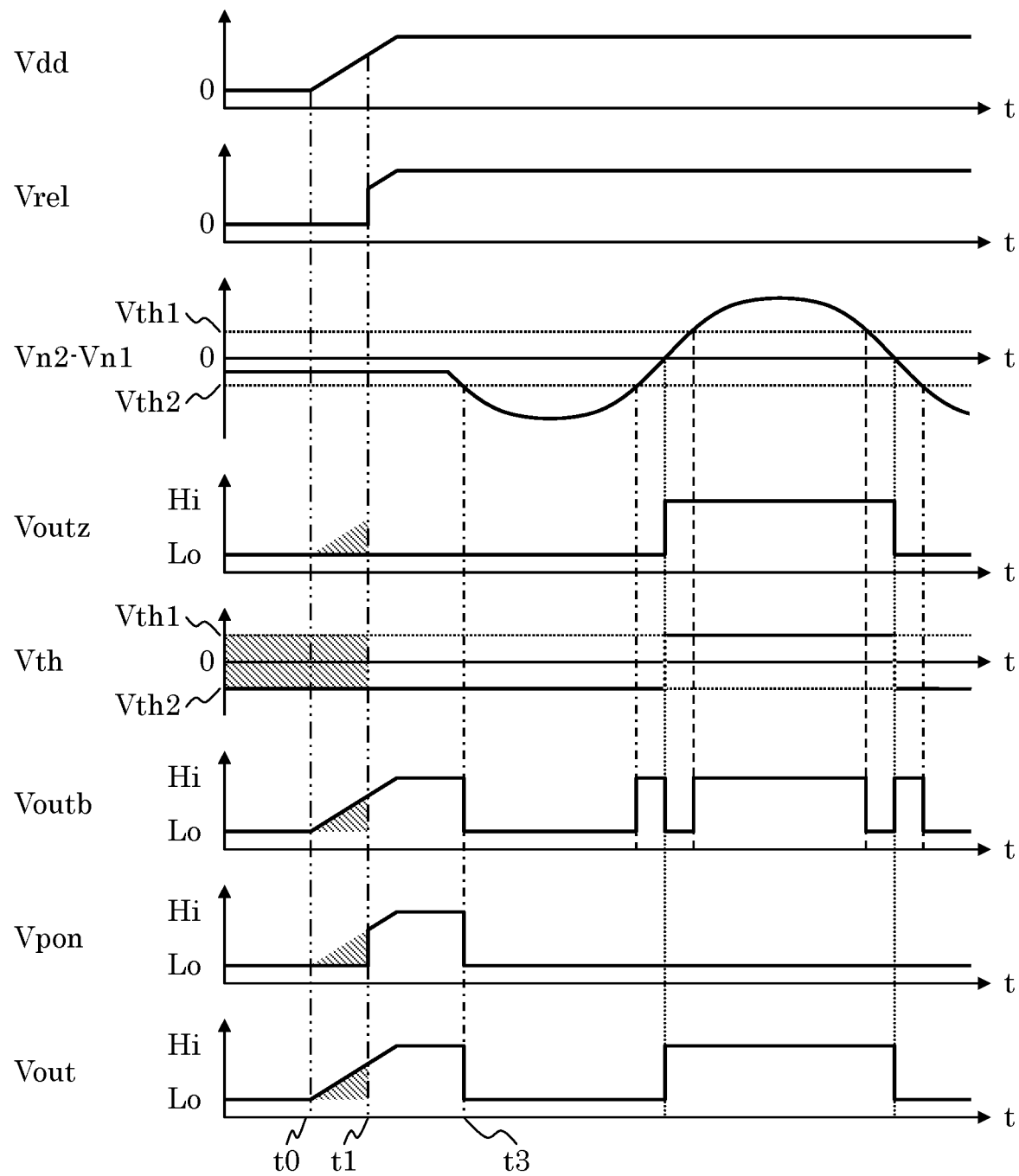
FIG. 5 is a view illustrating an operation of the zero cross detection circuit according to the first embodiment.

FIG. 5 is a figure illustrating an operation of the zero cross detection circuit 1 when the power is turned on in the case of a weak negative signal, i.e., when $Vth2<Vn2-Vn1<0$ holds. The waveforms of the power supply voltage Vdd and the output voltage Vrel are the same as those of FIG. 3 and hatched portions are also the same as those of FIG. 3. The waveforms of the Voutz, the Voutb, the Vpon, and the Vout are also the same as those of FIG. 3 until time t1.

Immediately after time t1, since $Vn2-Vn1<0$ holds, the zero-crossing signal generation circuit 10 provides a low level to the output voltage Voutz. Accordingly, the voltage Vth2 is selected for the threshold voltage Vth of the comparator circuit 20. Since $Vn2-Vn1>Vth2$ holds, the comparator circuit 20 provides a high level to the output voltage Voutb. The logic circuit 30 determines that a small signal is supplied because the output voltage Voutz is at a low level, the output voltage Voutb is at a high level, and the output voltage Voutz and the output voltage Voutb are at different levels. The logic circuit 30 does not change the output voltage Vout and holds the high level which is the immediate preceding voltage. The high level is held also for the voltage Vpon.

Change of the Vn2–Vn1 starts after time t1 and reaches $Vn2-Vn1=Vth2$ at time t3. At time immediately after time t3, $Vn2-Vn1<Vth2$ holds and the comparator circuit 20 provides a low level to the output voltage Voutb. The logic circuit 30 determines that a sufficiently large signal is supplied because the output voltage Voutz and the output voltage Voutb are at low levels and are at the same level. The logic circuit 30 provides a voltage determined from the output voltage Voutb of the comparator circuit 20, i.e., a low level, to the output voltage Vout. The voltage Vpon transitions to a low level from a high level. After this operation, the logic circuit 30 operates to provide a voltage determined from the output voltage Voutz of the zero-crossing signal generation circuit 10 to the output voltage Vout.

Figure 6:
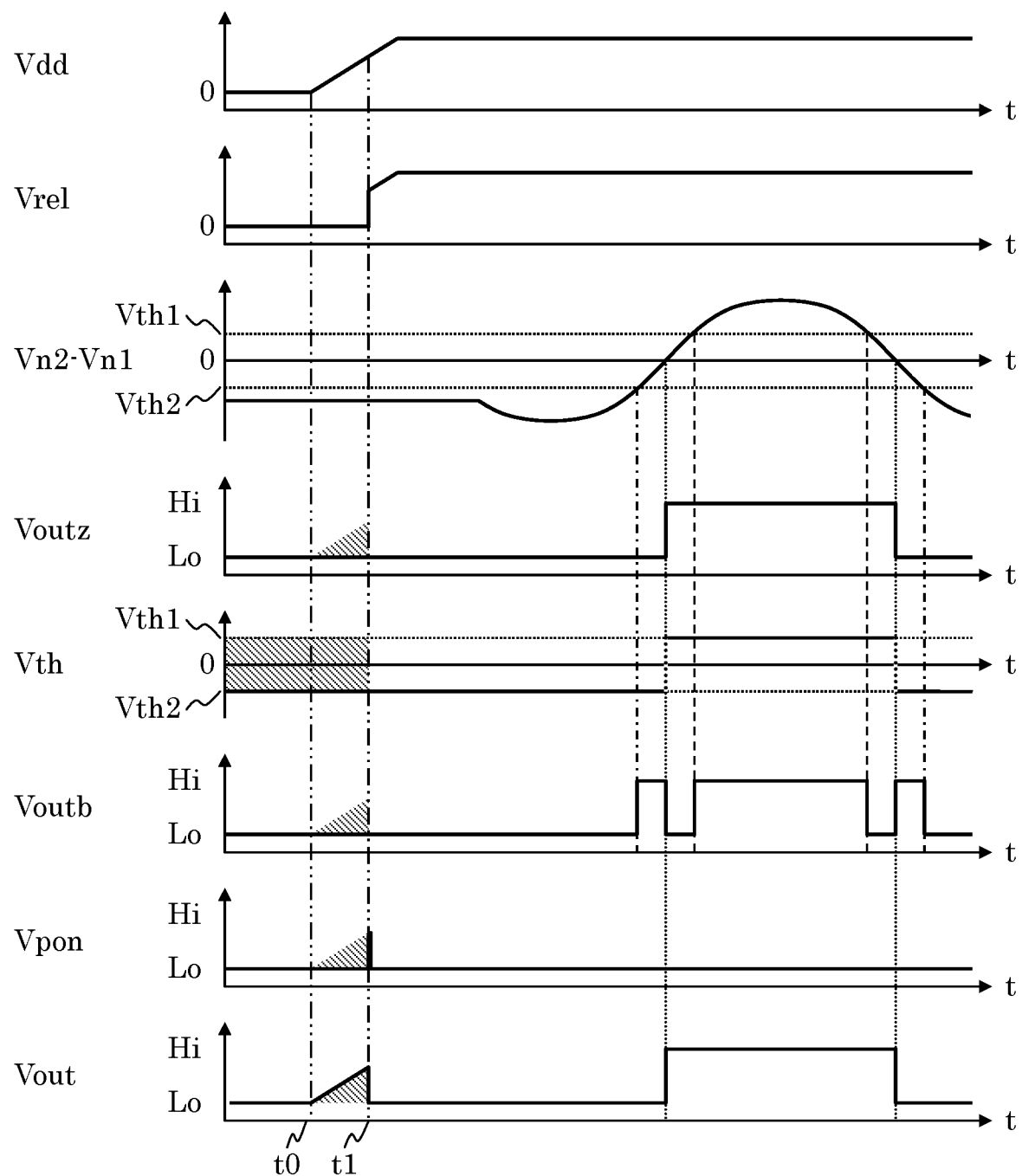
FIG. 6 is a view illustrating an operation of the zero cross detection circuit according to the first embodiment.

FIG. 6 is a figure illustrating an operation of the zero cross detection circuit 1 when the power is turned on in the case of a sufficiently strong negative signal, i.e., when $Vn2-Vn1<Vth2$ holds. The waveforms of the power supply voltage Vdd and the output voltage Vrel are the same as those of FIG. 3 and hatched portions are also the same as those of FIG. 3. The waveforms of the Voutz, the Vpon, and the Vout at time until time t1 are also the same as those of FIG. 3.

Immediately after time t1, since $Vn2-Vn1<0$ holds, the zero-crossing signal generation circuit 10 provides a low level to the output voltage Voutz. Accordingly, the voltage Vth2 is selected for the threshold voltage Vth of the comparator circuit 20. Since $Vn2-Vn1<Vth2$ holds, the comparator circuit 20 provides a low level to the output voltage Voutb. The logic circuit 30 determines that a sufficiently large signal is supplied because the output voltage Voutz and the output voltage Voutb are at low levels and are at the same level. The logic circuit 30 provides a voltage determined from the output voltage Voutb of the comparator circuit 20, i.e., a low level, to the output voltage Vout. The voltage Vpon transitions to a low level from a high level. After this operation, the logic circuit 30 operates to output a voltage determined from the output voltage Voutz of the zero-crossing signal generation circuit 10 to the output voltage Vout.

Figure 7:
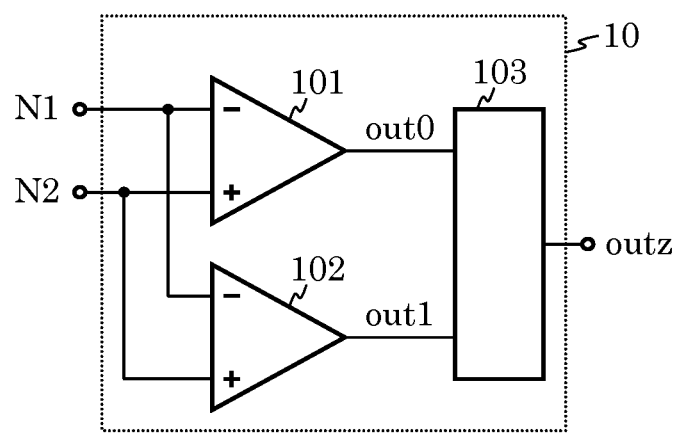
FIG. 7 is an example of a zero-crossing signal generation circuit according to the first embodiment.

Next, a noise rejection operation of the zero-crossing signal generation circuit 10 is described. FIG. 7 is a circuit diagram of an example of the zero-crossing signal generation circuit 10 in the first embodiment.

The zero-crossing signal generation circuit 10 is constituted from a comparator circuit 101, a comparator circuit 102, and a logic circuit 103. The comparator circuit 101 has an inverted input terminal, a non-inverted input terminal, and an output terminal out0. The comparator circuit 102 has an inverted input terminal, a non-inverted input terminal, and an output terminal out1. The inverted input terminal of the comparator circuit 101 and the inverted input terminal of the comparator circuit 102 are connected in common with the terminal N1. The non-inverted input terminal of the comparator circuit 101 and the non-inverted input terminal of the comparator circuit 102 are connected in common with the terminal N2. A first input signal and a second input signal are supplied to the terminal N1 and the terminal N2, respectively. The output terminal out0 of the comparator circuit 101 and the output terminal out1 of the comparator circuit 102 are connected to the logic circuit 103. The logic circuit 103 receives a comparison result of the output terminal out0 and a comparison result of the output terminal out1 respectively as input and provides a logical operation result from the output terminal outz as the first comparison result. In the following description, voltages of the output terminal out0 and the output terminal out1 are an output voltage Vout0 and an output voltage Vout1, respectively.

Figure 8:
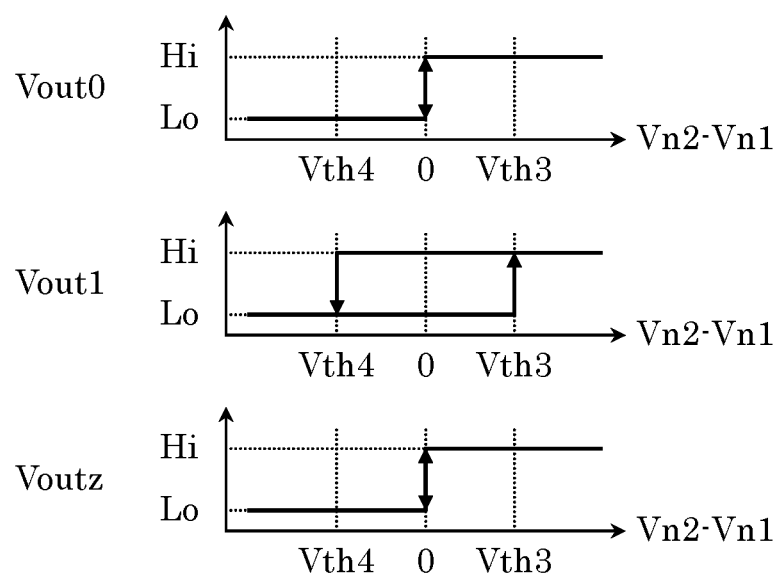
FIG. 8 is a view illustrating an operation of each element of the example of the zero-crossing signal generation circuit according to the first embodiment.

Next, an operation of the zero-crossing signal generation circuit 10 is described with reference to FIG. 8 and FIG. 9.

First, an operation of the comparator circuit 101 is described. The operation of the comparator circuit 101 is to provide a high level from the output terminal out0 when a voltage supplied to the non-inverted input terminal is higher than a voltage supplied to the inverted input terminal and, conversely, to provide a low level from the output terminal out0 when a voltage supplied to the non-inverted input terminal is lower than a voltage supplied to the inverted input terminal. FIG. 8 illustrates details of the operation. Herein, the horizontal axis indicates an input voltage difference between the voltage Vn1 and Vn2 and the vertical axis indicates output voltages thereof. As illustrated in FIG. 8, the output voltage Vout0 becomes a high level when the voltage Vn2 is higher than the voltage Vn1, i.e., when Vn2−Vn1>0 holds. Conversely, the output voltage Vout0 becomes a low level when the voltage Vn2 is lower than the voltage Vn1, i.e., when Vn2−Vn1<0 holds. The transition to a low level from a high level of the output voltage Vout0 occurs at Vn2−Vn1=0. The transition to a high level from a low level of the output voltage Vout0 similarly occurs at Vn2−Vn1=0.

Figure 9:
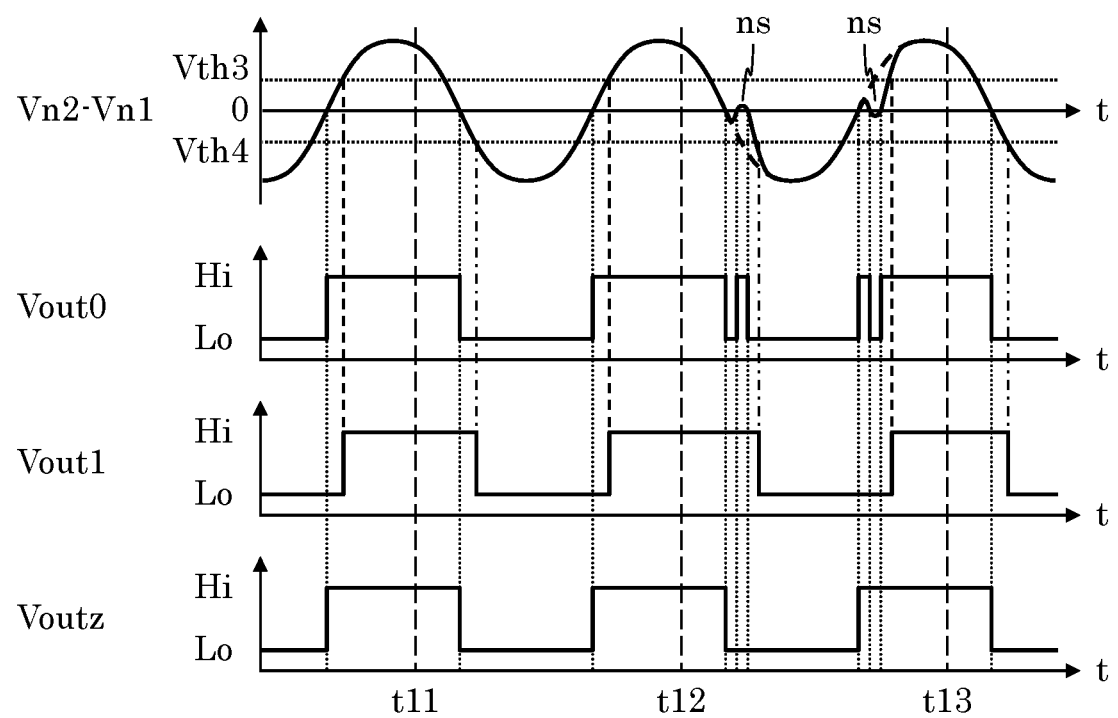
FIG. 9 is a view illustrating an operation of the example of the zero-crossing signal generation circuit according to the first embodiment.

FIG. 9 illustrates an operation of the comparator circuit 101 when the input voltage difference Vn2−Vn1 changes with time. Herein, the horizontal axis indicates a passage of time and the vertical axis indicates an input voltage difference or an output voltage. The input voltage difference Vn2−Vn1 changes with passage of time and can take various values, and is referred to, in particular, as zero crossing when Vn2−Vn1=0 holds. The output voltage Vout0 varies with the change of the input voltage difference Vn2−Vn1 with time. The output voltage Vout0 becomes a high level when Vn2−Vn1>0 holds and becomes a low level when Vn2−Vn1<0 holds. The output voltage Vout0 represents zero cross detection when Vn2−Vn1=0 holds, i.e., Vn1=Vn2.

Next, an operation of the comparator circuit 102 is described. The operation of the comparator circuit 102 is to provide a high level from the output terminal out1 when a voltage supplied to the non-inverted input terminal is higher than the sum of a voltage supplied to the inverted input terminal and a voltage Vth3 and, conversely, to provide a low level from the output terminal out1 when a voltage supplied to the non-inverted input terminal is lower than the sum of a voltage supplied to the inverted input terminal and a voltage Vth4. FIG. 8 illustrates details of the operation. As illustrated in FIG. 8, the output voltage Vout1 becomes a high level when the voltage Vn2 is higher than the sum of the voltage Vn1 and the voltage Vth3, i.e., when Vn2−Vn1>Vth3 holds, and becomes a low level when the voltage Vn2 is lower than the sum of the voltage Vn1 and the voltage Vth4, i.e., when Vn2−Vn1<Vth4 holds. Herein, the voltage Vth3 indicates a magnitude of the hysteresis which is a positive value and is on the plus side and the voltage Vth4 indicates a magnitude of the hysteresis which is a negative value and is on the minus side. The transition of the output voltage Vout1 from a high level to a low level occurs at Vn2−Vn1=Vth4. The transition of the output voltage Vout1 from a low level to a high level occurs at Vn2−Vn1=Vth3. When the Vn2−Vn1 is between the Vth3 and the Vth4, a high level or a low level is supplied according to the immediate preceding condition. More specifically, the comparator circuit 102 operates as a comparator circuit having a hysteresis width |Vth3|+|Vth4|.

FIG. 9 illustrates an operation of the comparator circuit 102 when the input voltage difference Vn2−Vn1 changes with time. The output voltage Vout1 varies with the change of the input voltage difference Vn2−Vn1 with time. At time t11, i.e., when Vn2−Vn1>Vth3 holds, a high level is provided to the output voltage Vout1 and maintained for a while, and when Vn2−Vn1<Vth4 holds with a reduction in Vn2−Vn1, transition of the output voltage Vout1 from the high level to a low level occurs and the low level is maintained for a whole, and then transition from the low level to a high level occurs when Vn2−Vn1>Vth3 holds with an increase in Vn2−Vn1.

Next, an operation of the logic circuit 103 is described. The operation of the logic circuit 103 is to determine the logic state of the output voltage Voutz according to the logic states of the output voltage Vout0 and the output voltage Vout1. More specifically, the logic circuit 103 causes the transition of the Voutz from a high level to a low level by the transition of the Vout0 from a high level to a low level when the Vout1 is at a high level. When the Voutz is originally at a low level, the Voutz does not vary. The Voutz does not vary by the transition of the Vout0 from a low level to a high level. When the Vout1 is at a low level, the transition of the Voutz from a low level to a high level is caused by the transition of the Vout0 from a low level to a high level. When the Voutz is originally at a high level, the Voutz does not vary. The Voutz does not vary by the transition of the Vout0 from a high level to a low level. The operation above is next described with reference to FIG. 9.

In FIG. 9, the output voltage Vout0 and the output voltage Vout1 are at high levels at time t11. Thereafter, the input voltage difference Vn2−Vn1 decreases with a passage of time, and at a zero crossing, the Vout0 transitions from a high level to a low level. At this time, since the Vout1 is at a high level, the logic circuit 103 provides to the Voutz the detection of zero crossing of the Vout0 from a high level to a low level. Thereafter, when Vn2−Vn1<Vth4 holds with a passage of time, the Vout1 transitions from a high level to a low level. Thereafter, when the Vn2−Vn1 increases with a passage of time, at a zero crossing, the Vout0 transitions from a low level to a high level. At this time, since the Vout1 is at a low level, the logic circuit 103 provides to the Voutz the detection of zero crossing of the Vout0 from a low level to a high level. Thereafter, when Vn2−Vn1>Vth3 holds with a passage of time, the Vout1 transitions from a low level to a high level. Thereafter, at time t12 with a passage of time, the zero-crossing signal generation circuit 10 enters the same condition as that at time t11.

At time t12, the output voltage Vout0 and the output voltage Vout1 are at high level. Thereafter, when the Vn2−Vn1 decreases with a passage of time, and at a zero crossing, the Vout0 transitions from a high level to a low level. At this time, since the Vout1 is at a high level, the logic circuit 103 provides to the Voutz the detection of zero crossing of the Vout0 from a high level to a low level. Thereafter, with a passage of time, the Vn2−Vn1 passes zero crossing twice by a noise ns and the output voltage Vout0 transitions from a low level to a high level and further transitions from a high level to a low level. At this time, since the Vout1 is at a high level, the logic circuit 103 operates so as not to provides to the Voutz the transition of the Vout0 from a low level to a high level. The detection of the zero crossing caused by the noise therefore does not appear in the output terminal outz. When Vn2−Vn1<Vth4 holds with a further passage of time, the Vout1 transitions from a high level to a low level. Thereafter, Vn2−Vn1 increases with a passage of time, and at a zero crossing, the Vout0 transitions from a low level to a high level. At this time, since the Vout1 is at a low level, the logic circuit 103 provides to the Vout the detection of zero crossing of the Vout0 from a low level to a high level. Thereafter, with a passage of time, the Vn2−Vn1 passes zero crossing twice by another noise ns and the output voltage Vout0 transitions from a high level to a low level and further transitions from a low level to a high level. At this time, since the Vout1 is at a low level, the logic circuit 103 operates so as not to provide to the Voutz the transition of the Vout0 from a high level to a low level. The detection of the zero crossing caused by the other noise therefore does not appear in the output terminal outz. Thereafter, when Vn2−Vn1>Vth3 holds with a passage of time, the Vout1 transitions from a low level to a high level. Thereafter, at time t13 with a passage of time, the zero-crossing signal generation circuit 10 enters the same condition as that at time t11 and time 12.

As described above, the operation of the zero-crossing signal generation circuit 10 is described to show that zero crossing can be detected, that the influence of noise on the detection of zero crossing can be eliminated, and that a highly precise zero-crossing signal can be obtained by a simple circuit configuration.

With respect to the operation of the zero-crossing signal generation circuit 10, the voltage Vth3 and the voltage Vth4 are described as the hysteresis voltages of the comparator circuit 102 in this description. However, the function of the comparator circuit 102 may be divided into two comparator circuits, and then it may be determined whether the Vn2−Vn1 is larger or smaller than the voltage Vth3 in one comparator circuit and it may be determined whether the Vn2−Vn1 is larger or smaller than the voltage Vth4 in the other comparator circuit.

As described above, the operation of the sensor device having the zero cross detection circuit according to the first embodiment of the present invention is described to show that the zero crossing can be detected and the magnitude of an input signal can be more reliably detected immediately after turning on of the power supply voltage, i.e., at the start of the operation. More specifically, it is shown that the operation of the zero cross detection circuit according to the first embodiment of the present invention enables the detection of a zero-crossing point of a magnetic field to be applied to the hall element 2a and enables more reliable detection of the magnitude of a magnetic field at the start of the operation. In other words, in the application of detecting the relative positional relationship of the sensor device having the zero cross detection circuit of the present invention and a magnet, a point where an applied magnetic field to the sensor device is switched from the S pole to the N pole or a point where a magnetic field is switched from the N pole to the S pole can be detected with high accuracy and the relative position at the start of the operation can be more reliably detected by the change of the relative position. The zero cross detection circuit of the present invention is therefore suitable for use in a brushless motor or use in an encoder which needs to detect the rotation position of a rotor with high accuracy. When the sensor device having the zero cross detection circuit according to the first embodiment is used in a brushless motor, not only an improvement of the rotation performance by zero cross detection but an increase in the accuracy of the rotation position detection immediately after turning on of the power by the application of a strong magnetic field can be achieved and an operation at the start of rotation can be reliably performed.

The first embodiment is described giving detailed conditions for the sake of explanation, but the present invention is not limited thereto insofar as an operation and a circuit configuration satisfy the gist and the scope of the present invention. For example, although the high level and the low level of voltages are specified, the high level and the low level may be reversed, and combinations of the high level and the low level may be different. Moreover, although the description is given without referring to the time until the output voltage Vrel changes after reaching a voltage sufficient for performing a normal operation, a delay time may be provided.

Moreover, the voltage Vth3 and the voltage Vth4 may be equal to the voltage Vth1 and the voltage Vth2, respectively. Moreover, although the signal which controls the threshold voltage Vth of the comparator circuit 20 is defined as the output voltage Voutz of the zero-crossing signal generation circuit 10, the present invention is not limited thereto. The threshold voltage Vth may be controlled by a voltage based on the output voltage Voutz which is generated in the logic circuit 30. Moreover, a configuration may be acceptable in which the threshold voltage Vth of the comparator circuit 20 is controlled by its own output as with the comparator circuit 102 instead of controlling the threshold voltage Vth from the outside. Furthermore, the configuration in which the voltage Vpon is set to a low level when the output voltage Voutz and the output voltage Voutb have reached the same level is described. However, the present invention is not limited thereto insofar as it is constituted so that the output voltage Vout is a signal synonymous with one supplied based on the output voltage Voutb.

Second Embodiment

Figure 10:
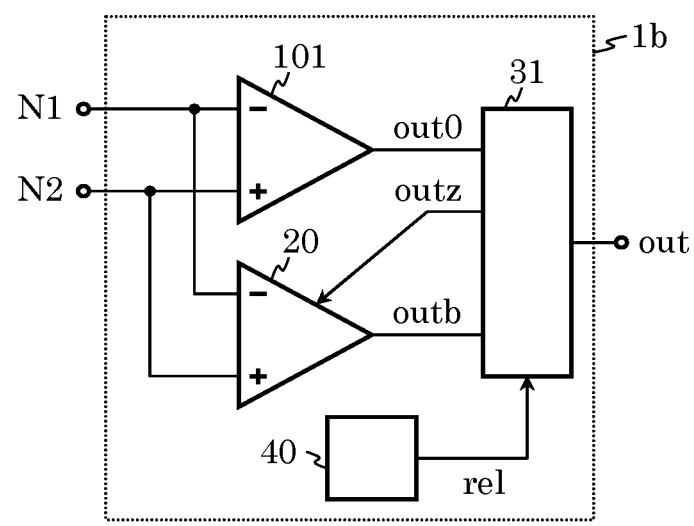
FIG. 10 is a block diagram of a zero cross detection circuit according to a second embodiment.

FIG. 10 is a block diagram illustrating a zero cross detection circuit according to a second embodiment of the present invention. The difference between the zero cross detection circuit 1b illustrated in FIG. 10 and the zero cross detection circuit 1 illustrated in FIG. 1 is that the zero-crossing signal generation circuit 10 is deleted, the comparator circuit 101 in the zero-crossing signal generation circuit 10 is added, the logic circuit 30 is deleted, and a logic circuit 31 is added.

The added elements are constituted and connected as follows. Moreover, due to the deleted elements, the following connection and operation are different from those of the zero cross detection circuit 1 illustrated in FIG. 1. As in the case of FIG. 1 and FIG. 7, the inverted input terminal of the comparator circuit 101 is connected to the terminal N1 and the non-inverted input terminal is connected in common with the terminal N2. Unlike the case of FIG. 1 and FIG. 7, the output terminal out0 of the comparator circuit 101 is connected to the logic circuit 31.

The function of the logic circuit 31 is an integration of the function of the logic circuit 103 to the function of the logic circuit 30 and specifically has an additional function as the first comparator circuit of generating the output signal Voutz from the output voltage Vout0 and the output voltage Voutb. The operation of the logic circuit 31 is to determine the logic state of the output voltage Vout which is the zero cross detection signal according to the logic states of the output voltage Voutz which is the first comparison result, the output voltage Voutb which is the second comparison result, and the output voltage Vrel which is the power supply voltage detection signal.

Specifically, the logic circuit 31 provides a voltage determined from the output voltage Voutb of the comparator circuit 20 which is the second comparator to the Vout immediately after the output voltage Vrel transitions to a high level from a low level. Thereafter, i.e., after the voltage determined from the output voltage Voutb of the comparator circuit 20 is provided to the Vout and the output voltage Vrel transitions to a low level from a high level, the comparator circuit 20 is controlled to perform the same operation as that of the comparator circuit 102 of FIG. 7 by the output signal Voutz. Further operation of the logic circuit 31 is to generate the output voltage Voutz from the output signal Vout0 and the output signal Voutb and output a voltage determined from the generation of the output voltage Voutz to the Vout.

The same output voltage Vout as that of the zero cross detection circuit 1 according to the first embodiment can be obtained from the zero cross detection circuit 1b according to the second embodiment by the configuration and the operation as described above and a reduction in the circuit scale by deleting the comparator circuit 102 can be achieved.

Third Embodiment

Figure 11:
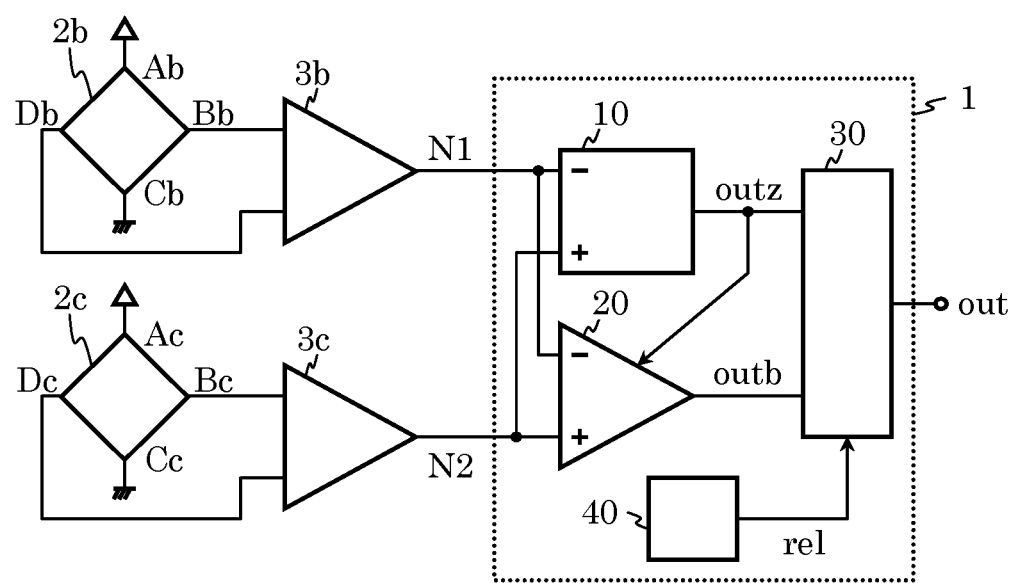
FIG. 11 is a block diagram illustrating a magnetic sensor device having the zero cross detection circuit according to a third embodiment.
Figure 12:
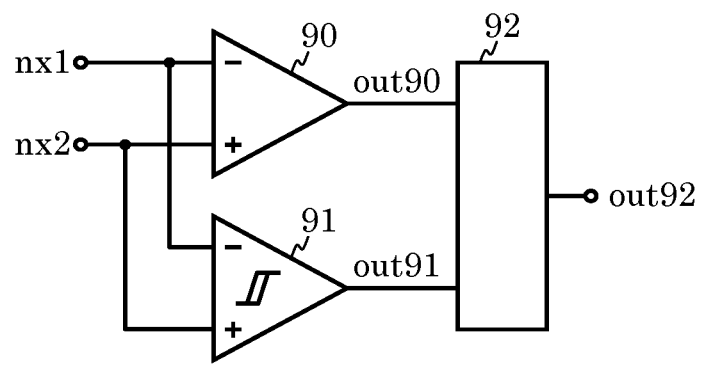
FIG. 12 is a circuit diagram of a conventional zero cross detection circuit.

FIG. 11 is a block diagram illustrating a magnetic sensor device having the zero cross detection circuit according to the third embodiment of the present invention.

The configuration of the connection between a hall element 2b and a differential amplifier 3b is the same as the configuration of the connection between the hall element 2a and the differential amplifier 3a of the magnetic sensor device illustrated in FIG. 1. Moreover, the configuration of the connection between a hall element 2c and a differential amplifier 3c is also the same as the configuration of the connection between the hall element 2a and the differential amplifier 3a illustrated in FIG. 1. While the differential amplifier 3a provides differential output, the differential amplifiers 3b and 3c provide single-ended output. A signal from the hall element 2b which is a magnetoelectric transducer is supplied to the differential amplifier 3b from a terminal Bb and a terminal Db, and the differential amplifier 3b amplifies the signal. The output of the differential amplifier 3b is connected to the terminal N1 of the zero cross detection circuit 1 of which the explanation was made in the first embodiment of the present invention. A signal from the hall element 2c which is a magnetoelectric transducer is supplied to the differential amplifier 3c from a terminal Bc and a terminal Dc, and the differential amplifier 3c amplifies the signal. The output of the differential amplifier 3c is connected to the terminal N2 of the zero cross detection circuit 1.

Herein, voltages of the terminals Bb, Db, Bc, and Dc are defined as VBb, VDb, VBc, and VDc, respectively, signal voltages of the hall elements 2b and 2c are defined as VDb−VBb and VDc−VBc, respectively, and both the amplification factors of the differential amplifiers 3b and 3c are defined as G. Then, the voltage Vn1 supplied to the terminal N1 and the voltage Vn2 supplied to the terminal N2 are expressed as follows:

$$Vn1 = G \times (VDb - VBb) \quad (2),$$

$$Vn2 = G \times (VDc - VBc) \quad (3).$$

The following equation is obtained from Equation (2) and Equation (3):

$$Vn2 - Vn1 = G \times \{(VDc - VBc) - (VDb - VBb)\} \quad (4).$$

The voltage difference Vn2−Vn1 takes accordingly a positive value, a negative value, or zero according to the magnetic fields applied to the hall element 2b and the hall element 2c. More specifically, the operation of the zero cross detection circuit 1 enables the detection of a zero-crossing point of a difference between magnetic fields applied to the hall element 2b and the hall element 2c and enables more reliable detection of the magnitude of the input signal at the start of the operation. In other words, the zero cross detection signal can be supplied when the signals of the two sensor elements are equal, and the signal can be supplied while discriminating which signal of the two sensor elements is larger and more reliable detection can be made which signal is larger at the start of the operation. The third embodiment is suitable for the use of detecting the rotation of a gear made of metal, such as iron, or a magnetic substance with a magnetic sensor device disposed between a magnet generating a bias magnetic field and the gear.

In the third embodiment, although the differential amplifiers 3b and 3c provide the single-ended output for convenience of the explanation, a differential output may be provided in order to achieve an improvement of noise tolerance. Moreover, although the case where the number of the hall elements is two is described, the number of the hall elements may be more than two. For example, a differential signal 1 of the two hall elements and a differential signal 2 of the other two hall elements may be generated, and then the zero crossing of the differential signal 1 and the differential signal 2 may be detected.

FIG. 1 and FIG. 11 illustrate examples of the sensor device having the zero cross detection circuit according to the embodiments of the present invention. Although the description gives specific examples for the explanation, the present invention is not necessarily limited to the configurations or the sensor elements and is applicable to a wide range of semiconductor circuits and sensor circuits. As an example, a spinning current circuit canceling an offset voltage which is a non-ideal component of a hall element which is a magnetoelectric transducer may be combined or a circuit and the like performing a chopping operation or an auto zero operation canceling an offset voltage which is a non-ideal component of a differential amplifier or a comparator circuit may be combined. Herein, when combined with the spinning current circuit or the circuit and the like performing a chopping operation or an auto zero operation, since signal processing is not made in continuous time domain but in discrete time domain, it is not preferable to perform calculation on each of the outputs from the zero-crossing signal generation circuit 10 and the comparator circuits 20, 101, and 102 by the combinational circuit to provide from the output terminal out. In this case, it is preferable to combine a sequential circuit, such as a latch circuit. Moreover, use of a zero cross detection circuit for sensor elements, such as a temperature sensor element, an acceleration sensor element, and a pressure sensor element, besides the magnetoelectric transducer, may be acceptable.

What is claimed is:

1. A zero cross detection circuit, comprising:
    a first comparator circuit configured to receive a first input signal and a second input signal which are output signals from a sensor element, and provide a first comparison result;
    a second comparator circuit having a hysteresis and configured to receive the first input signal and the second input signal, and provide a second comparison result;
    a power supply voltage detection circuit configured to provide a power supply voltage detection signal in response to a power supply voltage becoming equal to or larger than a predetermined voltage, wherein the power supply voltage is supplied to the first comparator circuit, the second comparator circuit, the power supply voltage detection circuit, and a logic circuit; and
    the logic circuit configured to provide a zero cross detection signal based on the first comparison result, the second comparison result, and the power supply voltage detection signal.

2. The zero cross detection circuit according to claim 1, wherein in response to a reception of the power supply voltage detection signal,
    the logic circuit provides the zero cross detection signal determined from the second comparison result in case the first comparison result and the second comparison result are at a same level, and
    the logic circuit provides the zero cross detection signal determined from the first comparison result and the second comparison result in case the first comparison result and the second comparison result are at different levels.

3. The zero cross detection circuit according to claim 1, wherein
    the second comparator circuit has a threshold voltage selection terminal receiving the first comparison result, and
    a first threshold voltage and a second threshold voltage are switched at the second comparator circuit according to the first comparison result received at the threshold voltage selection terminal.

4. The zero cross detection circuit according to claim 2, wherein
    the second comparator circuit has a threshold voltage selection terminal receiving the first comparison result, and
    a first threshold voltage and a second threshold voltage are switched at the second comparator circuit according to the first comparison result received at the threshold voltage selection terminal.

5. A sensor device comprising:
    a sensor element configured to output a signal according to strength of a physical quantity to be applied; and
    the zero cross detection circuit according to claim 1 configured to perform zero cross detection of a signal supplied from the sensor element.

6. A sensor device comprising:
    a sensor element configured to output a signal according to strength of a physical quantity to be applied; and
    the zero cross detection circuit according to claim 2 configured to perform zero cross detection of a signal supplied from the sensor element.

7. A sensor device comprising:
    a sensor element configured to output a signal according to strength of a physical quantity to be applied; and
    the zero cross detection circuit according to claim 3 configured to perform zero cross detection of a signal supplied from the sensor element.

8. A sensor device comprising:
    a sensor element configured to output a signal according to strength of a physical quantity to be applied; and
    the zero cross detection circuit according to claim 4 configured to perform zero cross detection of a signal supplied from the sensor element.

* * * * *